US006249140B1

(12) United States Patent
Shigihara

(10) Patent No.: US 6,249,140 B1
(45) Date of Patent: Jun. 19, 2001

(54) METHOD OF SCREENING SEMICONDUCTOR LASER DEVICE USING TEMPERATURE CYCLING AND VARIABLE DRIVING CURRENT

(75) Inventor: Kimio Shigihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/252,916

(22) Filed: Feb. 19, 1999

(30) Foreign Application Priority Data

Sep. 2, 1998 (JP) .................................................. 10-248185

(51) Int. Cl.$^7$ .................................................. G01R 31/26
(52) U.S. Cl. .............................. 324/767; 324/760; 372/43
(58) Field of Search ............................ 372/34, 33, 38.07, 372/43, 45, 46, 38, 29; 438/14; 356/121, 237.1; 324/765, 760, 767

(56) References Cited

U.S. PATENT DOCUMENTS

| 4,573,255 | 3/1986 | Gordon et al. ............................ 29/574 |
| 5,835,516 | * 11/1998 | Miyashita et al. ...................... 372/46 |
| 6,043,872 | * 3/2000 | Nagata .................................. 356/121 |

OTHER PUBLICATIONS

Beister et al., "Monomode Emission At 350mW And High Reliability With InGaAs/AlGaAs (λ=1020nm) Ridge Waveguide Laser Diodes", Electronics Letters, vol. 34, No. 8, Apr. 1998, p. 778.

* cited by examiner

Primary Examiner—Teresa M. Arroyo
Assistant Examiner—Darienne Monbleau
(74) Attorney, Agent, or Firm—Leydig, Voit & Mayer, Ltd.

(57) ABSTRACT

A method of screening semiconductor laser devices which fail due to sudden deterioration and initial failures. Semiconductor laser devices are screened by thermal cycling wherein the devices are kept at a high temperature and a low temperature alternately while supplying a driving current.

15 Claims, 2 Drawing Sheets

METHOD OF SCREENING SEMICONDUCTOR LASER DEVICE USING TEMPERATURE CYCLING AND VARIABLE DRIVING CURRENT

BACKGROUND OF THE INVENTION

1. Field of the Invention

The present invention relates to a method of screening a semiconductor laser device and, more particularly to a method of screening capable of rejecting a semiconductor laser device which fails due to sudden deterioration.

2. Description of the Prior Art

FIG. 3 shows the result of an endurance test of InGaAs/AlGaAs semiconductor laser devices conducted by G. Beister et al. (G. Beister et al. "Monomode emission at 350 mW and high reliability with InGaAs/AlGaAs ($\lambda$=1020 nm) ridge waveguide laser diodes", Electron. Lett., vol.34, pp.778–779, 1998). The endurance test was conducted under conditions of constant ambient temperature of 40° C. for the semiconductor laser device with such a driving current that produces constant optical output of 300 mW being supplied. In the drawing, numeral 101 denotes an initial failure device, 102 denotes a sudden failure device, 103 denotes device showing stable operation. Among ten devices subjected to the endurance test, seven devices (103) showed stable operation over 1000 hours. Two (101) of the ten devices showed initial failure with the operating current increasing at an early stage, and the remaining one (102) showed sudden failure without prior sign of deterioration. While the sudden failure in this test occurred after 180 hours of operation, sudden failures in general can take place at any time.

With a method of screening of the prior art which is conducted by keeping a constant optical output of semiconductor laser devices, for example, initial failure devices (101) can be rejected but sudden failure devices (102) cannot be rejected. Consequently, there has been a limitation to decreasing of failure rate of final products which have passed screening, resulting in such a problem that the devices cannot be used in the field of communication which requires high reliability.

The present inventors have found that the sudden failures are caused mainly by the breakdown of the active layer of the semiconductor laser device due to the migration of crystalline defects. The present inventors have also found that sudden failure of devices due to such crystal defects can be removed by screening semiconductor laser devices while supplying a driving current to the semiconductor laser devices and applying thermal cycles thereto, thus completing the present invention.

SUMMARY OF THE INVENTION

That is, an object of the present invention to provide a method of screening semiconductor laser devices wherein sudden failure devices as well as initial failure devices can be rejected.

The present invention provides a method of screening for rejecting semiconductor a laser device which fail due to sudden deterioration from a semiconductor laser device comprising semiconductor layers of different conductivity types, a semiconductor laser device comprising semiconductor layers of different conductivity types and having a regrowth interface formed through a plurality times of crystal growth, a semiconductor laser device comprising semiconductor layers of different conductivity types and having a GaAs substrate, or a semiconductor laser device comprising semiconductor layers of different conductivity types and having an InGaAs active layer and a GaAs substrate, said method being characterized by applying thermal cycles wherein the semiconductor laser devices are kept alternately in a high temperature state and a low temperature state, while supplying a driving current.

When subjected to thermal cycles with the driving current being supplied, deterioration of the device due to the optical output is accelerated during the low temperature period and deterioration of the device due to the driving current is accelerated during the high temperature period, while the deterioration may be further accelerated by changing the temperature thereby causing thermal strain in the semiconductor laser device. This method makes it possible to reject sudden failure devices, supposedly caused by migration of crystal defect, as well as initial failure devices, thereby increasing the rate of defect screening.

According to the result of the present inventors' research, it is known that sudden failure devices are difficult to screen out either by screening based on thermal cycles only or by screening based on driving current only. In other words, it is made possible to remove sudden failure devices only by applying both the thermal cycles and the driving current to the devices as the load.

The thermal cycle preferably comprises high temperature periods during which the temperature is raised to the highest at which a solder having the lowest melting point among the soldering materials used in the device does not melt, and low temperature periods during which the temperature is lowered to the minimum possible at which dew condensation does not occur on the surface of the semiconductor laser device.

Such thermal cycles make it possible to screen the semiconductor laser devices without giving damage thereto.

The present invention also provides a method of screening semiconductor laser devices by gradually increasing the driving current.

By gradually increasing the driving current, it is made possible to accelerate the deterioration while changing the thermal strain caused in the semiconductor laser devices, thereby improving the effect of screening.

The driving current is preferably increased gradually up to near a current level which causes a wear failure, from an initial value of current at which initial failure is detected.

By screening the semiconductor laser devices while increasing the driving current to a value near the level that causes wear failure, sudden failure devices can be screened out.

The driving current may also be increased gradually until threshold current begins to decrease after the threshold current of the semiconductor laser devices has been detected.

The driving current may also be increased gradually until the threshold current begins to increase again after the threshold current of the semiconductor laser devices has been detected and decreased.

The present invention also provides a method of screening the semiconductor laser devices by maintaining the driving current at a constant level not less than the current at which initial failure is rejected when the driving current is gradually increased.

Sudden failure devices can also be rejected by applying thermal cycles while maintaining the driving current at a constant level not less than the current at which initial failure is rejected.

The constant current level described above is preferably near the current level at which wear failures begin to occur when the driving current is gradually increased. By supplying such a relatively high driving current, the effect of screening can be improved.

The constant current level described above may also be the current level at which the threshold current of the semiconductor laser device begins to decrease when the driving current is gradually increased.

The constant current level described above may also be the level of the driving current in a range where the threshold current of the semiconductor laser device begins to increase after decreasing, while gradually increasing the driving current.

As will be apparent from the above description, the present invention makes it possible to effectively remove such devices that fail due to sudden deterioration and cannot be removed with the screening method of the prior art, as well as the initial failure devices, thus reducing the failure rate of devices significantly.

Consequently, it is made possible to greatly improve the reliability of the devices which have undergone screening.

Particularly, according to the present invention, it is made possible to remove such devices that fail due to sudden deterioration after the start of wear failures, thus further reducing the failure rate of devices.

DESCRIPTION OF THE PREFERRED EMBODIMENTS

Embodiment 1

A first embodiment of the present invention will now be described below by reference to FIG. 1.

Figure 1:
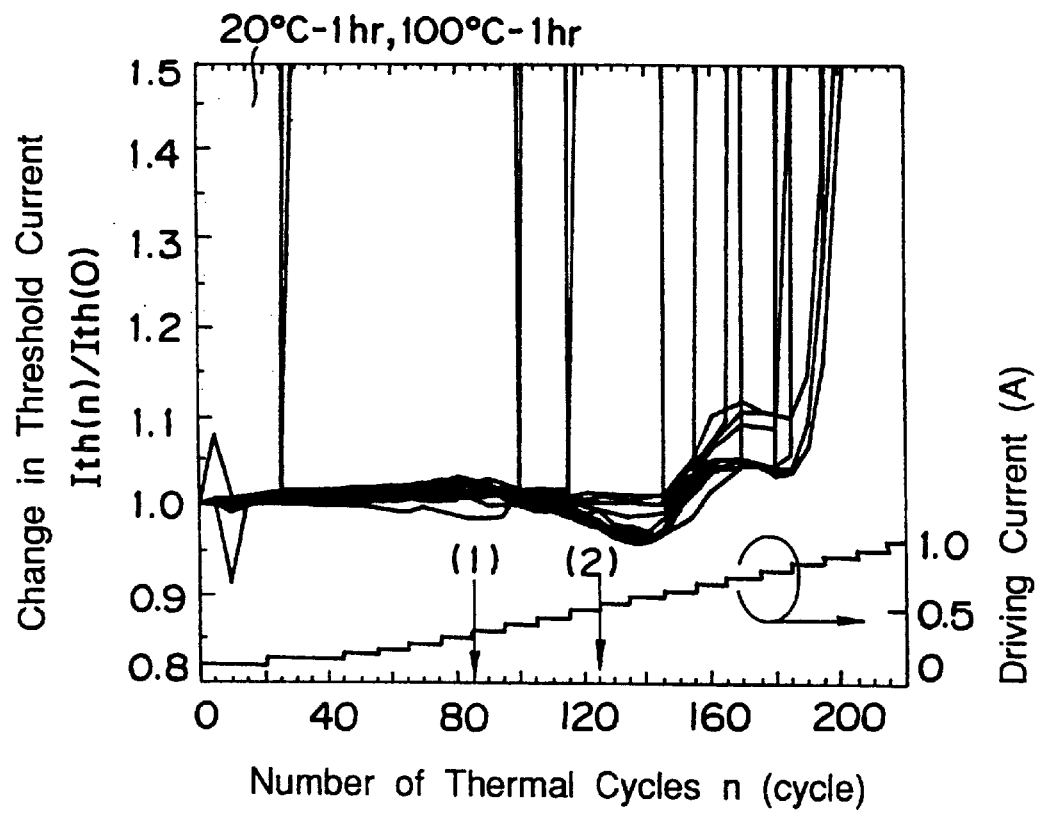
FIG. 1 is a graph showing the result of screening semiconductor laser devices according to the first and the second embodiments of the present invention.

FIG. 1 shows the change in the threshold current of the semiconductor laser device (Ith(n)/Ith(0)) plotted along the vertical axis on the left-hand side and the driving current supplied to the semiconductor laser device plotted along the vertical axis on the right-hand side, against the number of thermal cycles plotted along the horizontal axis.

In the thermal cycle of the experiment, the semiconductor laser device was kept at a low temperature of 20° C. for one hour and at a high temperature of 100° C. for one hour alternately. The driving current supplied to the semiconductor laser device was gradually increased as shown in FIG. 1.

The semiconductor laser devices were those left after removing such devices that showed initial failure after operating for several hundreds of hours with a constant optical output. This means that the semiconductor laser devices subjected to the experiment were those free of initial failure.

As will be seen from FIG. 1, as the semiconductor laser devices continue to undergo temperature cycles with the driving current being gradually increased, some devices begin to fail in the first several tens of cycles followed by a period without failure. In this period, almost no change in the threshold current (Ith(n)/Ith(0)) occurs.

As the semiconductor laser devices continue to undergo temperature cycles with the driving current being increased, the threshold current begins to decrease and subsequently begins to increase again. Wear failures of the semiconductor laser device begin to occur around this time, eventually leading to all devices failing due to wear.

In this experiment, because initial failure devices are omitted from the subjects, the devices which failed after several tens of temperature cycles are considered to have failed due to sudden deterioration.

In this embodiment, screening was continued while repeating the thermal cycles and increasing the driving current until the end (arrow 1) of the period during which the threshold voltage hardly changed, and a long-period endurance test was conducted on devices which have undergone the screening. The results are shown in FIG. 2.

The long-period endurance test was conducted on 20 devices which have undergone the screening under conditions of ambient temperature 50° C. and optical output of 100 mW, and on 10 devices which have undergone the screening under conditions of ambient temperature 50° C. and optical output of 150 mW.

Figure 2:
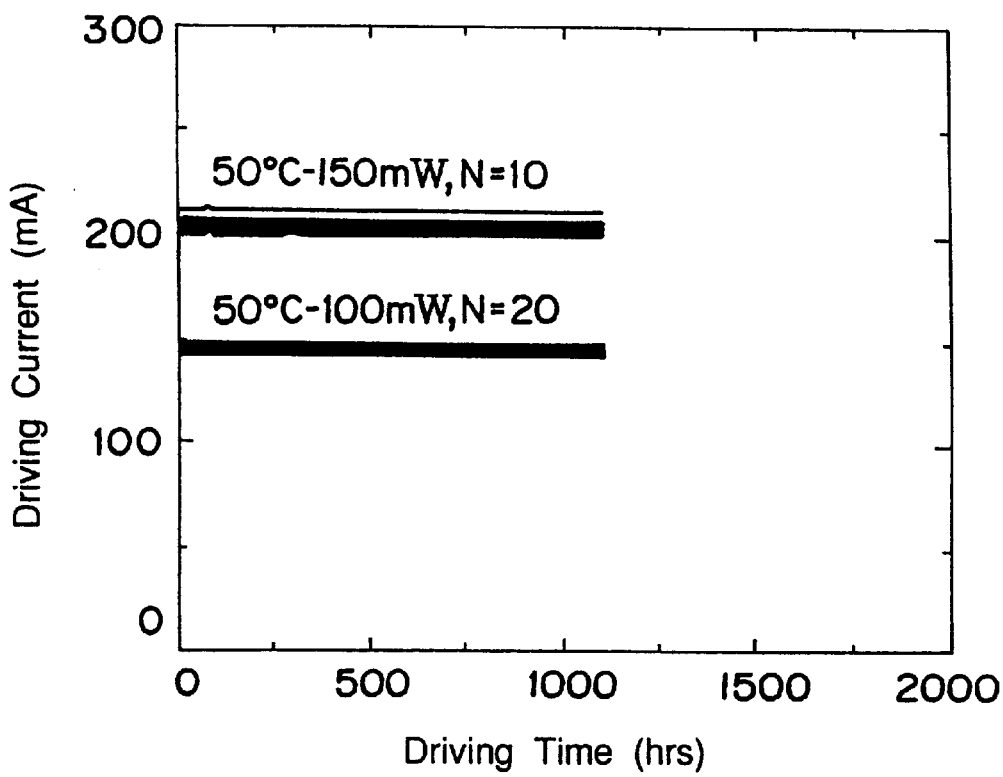
FIG. 2 is a graph showing the result of long-period endurance test of semiconductor laser devices which have been screened according to the first embodiment of the present invention.
Figure 3:
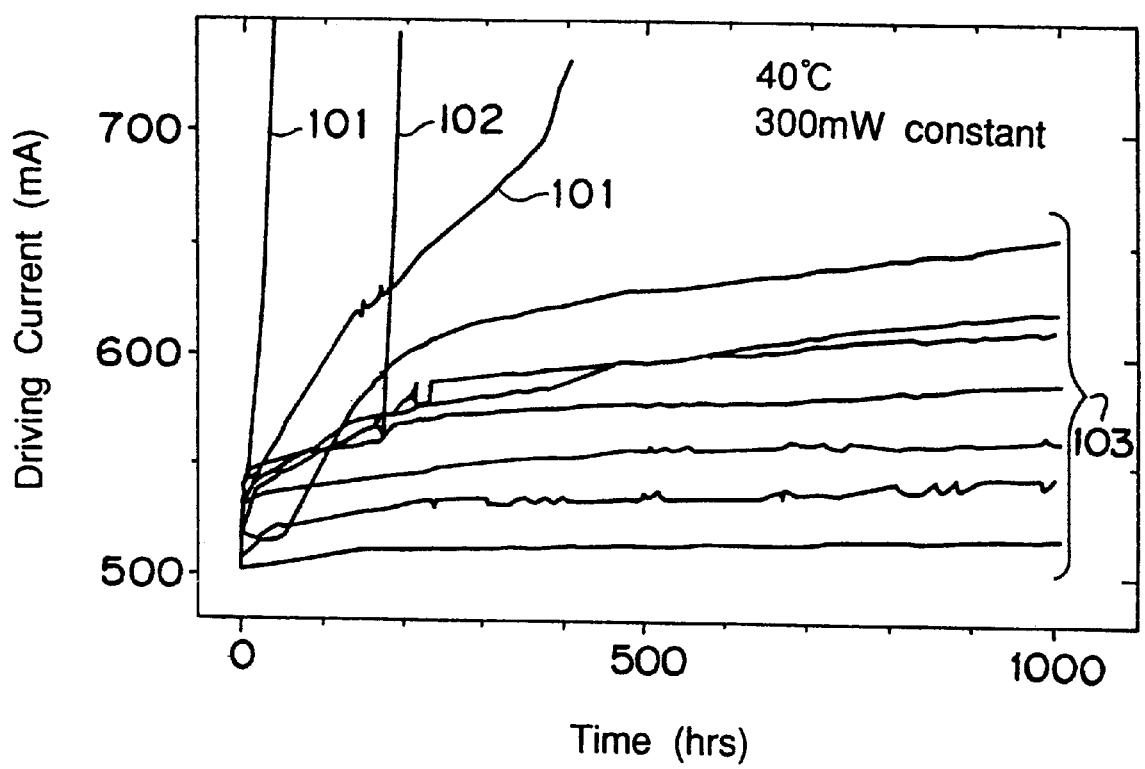
FIG. 3 is a graph showing the result of endurance test of semiconductor laser devices.

As will be seen from FIG. 2, all of the devices showed stable operation without deterioration after 1100 hours have passed since the start of the long-period endurance test.

This result shows that the method of screening (screening up to the point indicated by arrow 1) according to this embodiment of the present invention is very effective, and that this method of screening makes it possible to effectively reject devices which fail due to sudden deterioration that cannot be removed by the conventional screening method.

While the thermal cycle of this embodiment comprises a period of low temperature of 20° C. and a period of high temperature of 100° C., the high temperature may also be set to the highest temperature at which a solder having the lowest melting point among the soldering materials used in the semiconductor laser device does not melt, and the low temperature may be set arbitrarily in a range where dew condensation does not occur on the surface of the semiconductor laser device. The rate of increasing the driving current may also be set faster or slower.

Settings of the thermal cycle and the rate of increasing the driving current can be done similarly also in the second through the fourth embodiments described below.

Embodiment 2

A second embodiment of the present invention will now be described below with reference to FIG. 1.

In the screening process shown in FIG. 1, wear failures are considered to begin to occur around 100th temperature cycle, and all devices failed due to wear around the 200th cycle. However, as will be seen from FIG. 1, a considerable number of devices remain after wear failure began to occur, and therefore there is a possibility that some devices still fail due to sudden deterioration in an early stage of wear failures. Consequently, the failure rate of devices can be reduced significantly by removing devices which deteriorate after wear failures begin.

Thus devices which fail due to sudden deterioration can be removed further by screening to a point indicated by arrow 2 in FIG. 1, namely by increasing the current until after the start of wear failures.

Such a screening process is carried out by gradually increasing the driving current until the threshold current reverse to increase, after decreasing, while detecting the threshold current of the semiconductor laser devices. This is because, according to the inventor's finding, failures which occur after the threshold current increases following a decrease are mostly considered to be failures due to wear deterioration.

Embodiment 3

A third embodiment of the present invention will now be described below with reference to FIG. 1.

While the screening processes in the first and the second embodiments are carried out by applying thermal cycles while gradually increasing the driving current, the screening process of this embodiment is carried out by supplying a constant driving current which is set to the value of driving current at which the threshold current of the semiconductor laser device begins to decrease when the driving current is gradually increased.

In the screening process of this embodiment, the thermal cycle comprises a period of low temperature of 20° C. and a period of high temperature of 100° C. with the driving current being kept constant at 0.3 A. Despite the constant driving current, the threshold current showed changes similar to those shown in FIG. 1. That is, in the early stage of a small number of thermal cycles, only several devices fail, followed by a stable period during which no devices fail. When the number of thermal cycles exceeds several tens, wear failures begin.

Thus devices which fail due to sudden deterioration can also be removed by applying thermal cycles while keeping the driving current constant at a level higher than the current which causes initial failures to begin and lower than the current which causes wear failures to begin.

Consequently, when screening is carried out by applying thermal cycles comprising a period of low temperature of 20° C. and a period of high temperature of 100° C. with the driving current being kept constant at 0.3 A, devices which fail due to sudden deterioration can also be removed by repeating about 60 thermal cycles or more, preferably about 80 cycles or more.

Embodiment 4

A fourth embodiment of the present invention will now be described below with reference to FIG. 1.

While the screening process in the second embodiment is carried out by applying thermal cycles while gradually increasing the driving current, the screening process of this embodiment is carried out by supplying a constant driving current which is set to the value of driving current at which the threshold current of the semiconductor laser device reverse, to increase after decreasing, when the driving current is gradually increased. The driving current has such a value that can cause wear failures and is greater than the driving current used in the third embodiment.

According to this embodiment, because sudden failures occur even after wear failures have begun to occur as in the case of the second embodiment, devices which fail due to sudden deterioration, which cannot be removed in the third embodiment, can be removed by screening while supplying the driving current described above.

Thus by applying about 100 thermal cycles, preferably 120 cycles with the driving current being kept constant at 0.5 A, devices which fail due to sudden deterioration after the start of wear failures can also be removed, thus reducing the failure rate significantly.

What is claimed is:

1. A method of screening semiconductor laser devices and selecting semiconductor laser devices having relatively long lifetimes, the method comprising:

driving a plurality of semiconductor laser devices with a driving current having a first magnitude while repeatedly cycling the semiconductor laser devices between a first temperature and a second temperature, the first temperature being higher than the second temperature;

discarding the semiconductor laser devices that fail while conducting the driving current of the first magnitude during cycling between the first and second temperatures;

increasing the driving current to a second magnitude while repeatedly cycling the temperature of the semiconductor laser devices that have not failed between the first and second temperatures;

discarding the semiconductor laser devices that fail while conducting the driving current of the second magnitude during cycling between the first and second temperatures; and measuring changes in threshold currents of the semiconductor laser devices as the driving current is further increased in magnitude during cycling between the first and second temperatures.

2. The method according to claim 1 wherein the first temperature is the highest temperature at which no solder within the semiconductor laser devices will melt and the second temperature is the minimum temperature at which no condensation forms on the semiconductor laser devices.

3. The method according to claim 1 wherein the first temperature is about 100° C. and the second temperature is about 20° C.

4. The method according to claim 1 including continuing to increase the driving current while cycling the semiconductor laser devices that have not failed between the first and second temperatures, and measuring changes in the respective current thresholds of the semiconductor laser devices that have not failed, and selecting the semiconductor laser devices that have not failed and for which the respective threshold currents have first begun decreasing, as driving current magnitude continues to increase during cycling between the first and second temperatures, as semiconductor laser devices having long lifetimes.

5. The method according to claim 4 including measuring changes in the respective current thresholds of the semiconductor laser devices that have not failed through at least eighty cycles between the first and second temperatures have been completed.

6. The method according to claim 1 including continuing to increase the driving current while cycling the semiconductor laser devices that have not failed between the first and second temperatures and measuring changes in the respective current thresholds of the semiconductor laser devices, and selecting the semiconductor laser devices that have not failed and for which the threshold current has decreased at a respective driving current magnitude and has begun to increase as the driving current magnitude continues to increase while cycling between the first and second temperatures, as semiconductor laser devices having long lifetimes.

7. The method according to claim 6 including, before selecting the semiconductor laser devices that have not failed and that have a long lifetime, completing at least one hundred twenty cycles between the first and second temperatures as the driving current magnitude has increased.

8. A method of screening semiconductor laser devices and selecting semiconductor laser devices having relatively long lifetimes, the method comprising:

driving a first plurality of semiconductor laser devices with a driving current having a first magnitude while repeatedly cycling the first plurality of semiconductor laser devices between a first temperature and a second temperature, the first temperature being higher than the second temperature;

discarding the semiconductor laser devices of the first plurality of semiconductor laser devices that fail while conducting the driving current of the first magnitude during cycling between the first and second temperatures;

increasing the driving current to a second magnitude while repeatedly cycling the semiconductor laser devices of the first plurality of semiconductor laser devices that have not failed, between the first and second temperatures;

discarding the semiconductor laser devices of the first plurality of semiconductor laser devices that fail while conducting the driving current of the second magnitude during cycling between the first and second temperatures;

measuring changes in threshold currents of the first plurality of semiconductor laser devices as the driving current is increased in magnitude, during cycling between the first and second temperatures, to determine the magnitude of a test current at which the threshold current of the first plurality of semiconductor laser devices that have not failed has first decreased during cycling between the first and second temperatures; and driving a second plurality of semiconductor laser devices with the test current while repeatedly cycling the second plurality of semiconductor laser devices between the first and second temperatures and selecting the semiconductor laser devices of the second plurality of semiconductor laser devices that have not failed as semiconductor laser devices having long lifetimes.

9. The method according to claim 8 including driving the second plurality of semiconductor laser devices with the test current while repeatedly cycling the second plurality of semiconductor laser devices between the first and second temperatures for at least sixty cycles.

10. The method according to claim 8 wherein the first temperature is the highest temperature at which no solder within the semiconductor laser devices will melt and the second temperature is the minimum temperature at which no condensation forms on the semiconductor laser devices.

11. The method according to claim 8 wherein the first temperature is about 100° C. and the second temperature is about 200° C.

12. A method of screening semiconductor laser devices and selecting semiconductor laser devices having relatively long lifetimes, the method comprising:

driving a first plurality of semiconductor laser devices with a driving current having a first magnitude while repeatedly cycling the first plurality of semiconductor laser devices between a first temperature and a second temperature, the first temperature being higher than the second temperature;

discarding the semiconductor laser devices of the first plurality of semiconductor laser devices that fail while conducting the driving current of the first magnitude during cycling between the first and second temperatures;

increasing the driving current to a second magnitude while repeatedly cycling semiconductor laser devices of the first plurality of semiconductor laser devices that have not failed, between the first and second temperatures;

discarding the semiconductor laser devices of the first plurality of semiconductor laser devices that fail while conducting the driving current of the second magnitude during cycling between the first and second temperatures;

measuring changes in threshold currents of the first plurality of semiconductor laser devices as the driving current is increased in magnitude, during cycling between the first and second temperatures, to determine the magnitude of a test current at which the threshold current has decreased at a driving current and has begun to increase as the driving current continues to increase during cycling between the first and second temperatures; and driving a second plurality of semiconductor laser devices with the test current while repeatedly cycling the second plurality of semiconductor laser devices between the first and second temperatures and selecting the semiconductor laser devices of the second plurality of semiconductor laser devices that have not failed as semiconductor laser devices having long lifetimes.

13. The method according to claim 12 including driving a second plurality of semiconductor laser devices with the test current while repeatedly cycling the second plurality of semiconductor laser devices between the first and second temperatures for at least one hundred cycles.

14. The method according to claim 12 wherein the first temperature is the highest temperature at which no solder within the semiconductor laser devices will melt and the second temperature is the minimum temperature at which no condensation forms on the semiconductor laser devices.

15. The method according to claim 12 wherein the first temperature is about 100° C. and the second temperature is about 20° C.

* * * * *